United States Patent [19]

McClure

[11] Patent Number: 5,612,918
[45] Date of Patent: Mar. 18, 1997

[54] REDUNDANCY ARCHITECTURE

[75] Inventor: David C. McClure, Carrollton, Tex.

[73] Assignee: SGS-Thomson Microelectronics, Inc., Carrollton, Tex.

[21] Appl. No.: 582,424

[22] Filed: Dec. 29, 1995

[51] Int. Cl.[6] .................................................. G11C 29/00
[52] U.S. Cl. ...................... 365/200; 365/225.7; 365/201
[58] Field of Search ............................. 365/200, 201, 365/225.7, 230.06

[56] References Cited

U.S. PATENT DOCUMENTS

| | | | |
|---|---|---|---|
| 4,228,528 | 10/1980 | Cenker et al. | 365/200 |
| 4,573,146 | 2/1986 | Graham et al. | 365/200 |
| 4,601,019 | 7/1986 | Shah et al. | 365/200 |
| 4,656,610 | 4/1987 | Yoshida et al. | 365/200 |
| 4,689,494 | 8/1987 | Chen et al. | 365/200 |
| 4,714,839 | 12/1987 | Chung | 307/441 |
| 4,734,889 | 3/1988 | Mashiko et al. | 365/200 |
| 4,791,615 | 12/1988 | Pelley, III et al. | 365/200 |
| 4,829,480 | 5/1989 | Seo | 365/200 |
| 4,833,652 | 5/1989 | Isobe et al. | 365/201 |
| 4,837,747 | 6/1989 | Dosaka et al. | 371/10 |
| 4,985,866 | 1/1991 | Nakaizuri | 365/200 |
| 5,034,925 | 7/1991 | Kato | 365/200 |
| 5,058,059 | 10/1991 | Matsuo et al. | 365/96 |
| 5,107,464 | 4/1992 | Sahara et al. | 365/200 |
| 5,124,948 | 6/1992 | Takazawa et al. | 365/200 |
| 5,146,429 | 9/1992 | Kawai et al. | 365/200 |
| 5,177,743 | 1/1993 | Shinoda et al. | 365/200 |
| 5,195,057 | 3/1993 | Kasa et al. | 365/200 |
| 5,257,229 | 10/1993 | McClure et al. | 365/200 |
| 5,262,994 | 11/1993 | McClure | 365/200 |
| 5,281,868 | 1/1994 | Morgan | 307/441 |
| 5,295,102 | 3/1994 | McClure | 365/200 |
| 5,299,164 | 3/1994 | Takeuchi et al. | 365/201 |
| 5,307,316 | 4/1994 | Takemae | 365/200 |
| 5,311,472 | 5/1994 | Ota | 365/200 |
| 5,337,278 | 8/1994 | Cho | 365/200 |
| 5,355,340 | 10/1994 | Coker et al. | 365/200 |
| 5,377,146 | 12/1994 | Reddy et al. | 365/200 |
| 5,381,370 | 1/1995 | Lacey et al. | 365/200 |
| 5,455,798 | 10/1995 | McClure | 365/200 |
| 5,471,426 | 11/1995 | McClure | 365/200 |

FOREIGN PATENT DOCUMENTS

| | | |
|---|---|---|
| 0290094 | 11/1988 | European Pat. Off. . |
| 0361404 | 4/1990 | European Pat. Off. . |
| 0376245 | 7/1990 | European Pat. Off. . |
| 3906897A1 | 9/1989 | Germany . |
| 2165971 | 4/1986 | United Kingdom . |
| 2231984 | 11/1990 | United Kingdom . |

OTHER PUBLICATIONS

Nishimura, et al., "A Redundancy Test-Time Reduction Technique in 1-Mbit DRAM with a Multibit Test Mode," IEEE Journal of Solid-State Circuits, vol. 24, No.1, Feb. 1989, pp. 43-49.

Kayano, et al., "25-ns 256K×1/64K×4 CMOS SRAM's" IEEE Journal of Solid-State Circuits, vol. SC-21, No. 5, Oct. 1986, pp. 686-690.

Hardee, et al., "A Fault-Tolerant 20 ns/375 mW 16K×1 NMOS Static Ram," J. Solid State Circuits, vol. SC-16, No. 5 (IEEE, 1981), pp. 435-443.

U.S. application No. 08/438,349, McClure et al. filed May 10, 1995.

U.S. application No. 08/438,903, McClure et al. filed May 10, 1995.

U.S. application No. 08/509,351, Lysinger filed Jul. 31, 1995.

Childs, et al., "An 18ns 4K×4 CMOS SRAM," J. Solid State Circuits, vol. SC-19, No. 5 (IEEE, 1984), pp. 545-551.

Sakurai, et al., "A Low Power 46 ns 256 kbit CMOS Static Ram with Dynamic Double Word Line," IEEE J. Solid State Circuits, vol. SC-19, No. 5 (IEEE, Oct. 1984), pp. 578-585.

*Primary Examiner*—Tan T. Nguyen
*Attorney, Agent, or Firm*—Theodore E. Galanthay; Lisa K. Jorgenson; Irena Lager

[57] ABSTRACT

A redundancy structure having fewer pass gates in the redundant decoder for quicker access to a redundant columns and a reduction in the complexity of the redundancy structure.

56 Claims, 6 Drawing Sheets

REDUNDANCY ARCHITECTURE

CROSS-REFERENCE TO RELATED APPLICATIONS

This application contains text and drawings in common with pending U.S. patent application entitled "Redundancy Control," by David C. McClure Ser. No. 08/580,827 (Attorney's Docket No. 95-C-143), which has the same effective filing date and ownership as the present application, and to that extent is arguably related to the present application, which is incorporated herein by reference.

BACKGROUND AND SUMMARY OF THE INVENTION

The present invention relates to the field of electronic devices having memory arrays, and is more specifically directed to redundancy schemes in such devices.

A redundant column is a column of memory cells that can replace a defective or malfunctioning memory column of a memory device. A fatal defect in one memory cell makes the cell inoperable. If the cell is not replaced the entire memory device can malfunction. Replacing a column containing a defect in one of its memory cells with a redundant column can make a memory device that would otherwise have been unusable usable, therefore greatly improving the yield of memory devices.

As the trend to increase the density of components per unit area of semiconductor devices continues, the size of the defect that can cause failure also shrinks. Additionally, as the size and total number of components in a memory device continues to increase so does the cost of each memory device, and therefore the cost of each non-usable memory device. Redundant columns are often used in memory devices to prevent an isolated defect from destroying the entire device.

Memory cells are usually arranged in rows and columns, and grouped into blocks composed of columns arranged into input/output groups. A memory cell's address is the intersection of its row and column.

The defects in the memory cells are discovered in initial testing and the redundant columns replace the columns containing defective cells. When a defect is found in a memory cell the address of a redundant column is conventionally mapped to the address of the column containing the defective cell. Therefore, when a read or write access is addressed to a bad column, the redundancy control logic will divert the read or write operation, so that the data is read or written into the appropriate location in the redundant column, which had been selected to replace the defective column. Thus, the outside system never sees the remapping performed by the redundancy logic.

The redundancy logic should operate fast enough so that the normal access times are preserved. If access time of a redundant column is significantly slower than the access time of a non-redundant, or primary column, the access time of the redundant column becomes the access time of the system. This imposes a speed penalty on the system for using redundant columns.

A goal in the semiconductor industry is to increase the speed of the circuit. Both the access time of the primary circuit and the amount of time that is considered to be a significant difference between the access time of the redundant and primary columns have decreased. A problem presented in the prior art is that redundancy logic has not been able to accommodate this increase in speed. The access time of the redundant column can now impose a speed penalty for accessing the redundant columns.

Additionally, redundant columns and redundant select circuitry to allow for the selection of the redundant columns increases the complexity of the memory device. This increases both the manufacturing time and the cost of the memory device. It is therefore necessary to balance the probable number of columns that have memory cells with defects with the cost of each additional redundant column to determine the number of redundant columns to add to the memory device. Reducing the complexity of the redundancy architecture without adversely affecting the flexibility and speed of the redundant column select has long been goal in memory design.

Further background on memories and on column redundancy can be found in: Prince, Betty, SEMICONDUCTOR MEMORIES, A HANDBOOK OF DESIGN, MANUFACTURE, AND APPLICATION, $2^{nd}$ ed., John Wiley & Sons, 1991; Hardee, et al., "A Fault-Tolerant 30 ns/375 mW 16K×1 NMOS Static RAM", *J. Solid State Circuits*, Vol. SC-16, No. 5 (IEEE, 1981), pp. 435–43; and Childs, et al., "An 18 ns 4K×4 CMOS SRAM", *J. Solid State Circuits*, Vol. SC-19, No. 5 (IEEE, 1984), pp. 545–51; ISSCC proceedings from 1975 to the present, all incorporated herein by reference.

SUMMARY OF THE INVENTION

An integrated circuit memory structure is disclosed that reduces the number of pass gates in a redundant decoder. When the redundant decoder is enabled it connects one column select signal to a redundant column. The redundant decoder of the present invention contains at least one redundant select circuit which is made up of an enabling circuit that controls each of group of sixteen pass gates. Each pass gate is connected in series with one fuse. Each combination of one pass gate and fuse is connected in parallel with the other fifteen. Thus, there is only one pass gate in the path of the column select signal in the redundant decoder. When the redundant select circuit is enabled fifteen of the sixteen fuses are blown, so that only one column select signal is connected to the redundant column.

One advantage of the present invention is that the speed of accessing redundant columns is increased without increasing the complexity of the circuit.

Another advantage of this invention is a reduction in the number of transistors in each redundant select circuit of the redundant decoder.

A further advantage of this invention is that the redundant column select circuitry is similar to the primary column select circuitry.

A particularly advantageous use of the current invention is in synchronous memory devices. The reduction of pass gates in the redundant select circuit in the redundant decoder improves the access time of redundant columns due to both the fewer transistors and the fact that a clock cycle is needed for the propagation of the signal through each pass gate.

Other advantages and objects of the invention will be apparent to those of ordinary skill in the art having reference to the following specification together with the drawings.

DETAILED DESCRIPTION OF THE PREFERRED EMBODIMENT

Figure 1A:
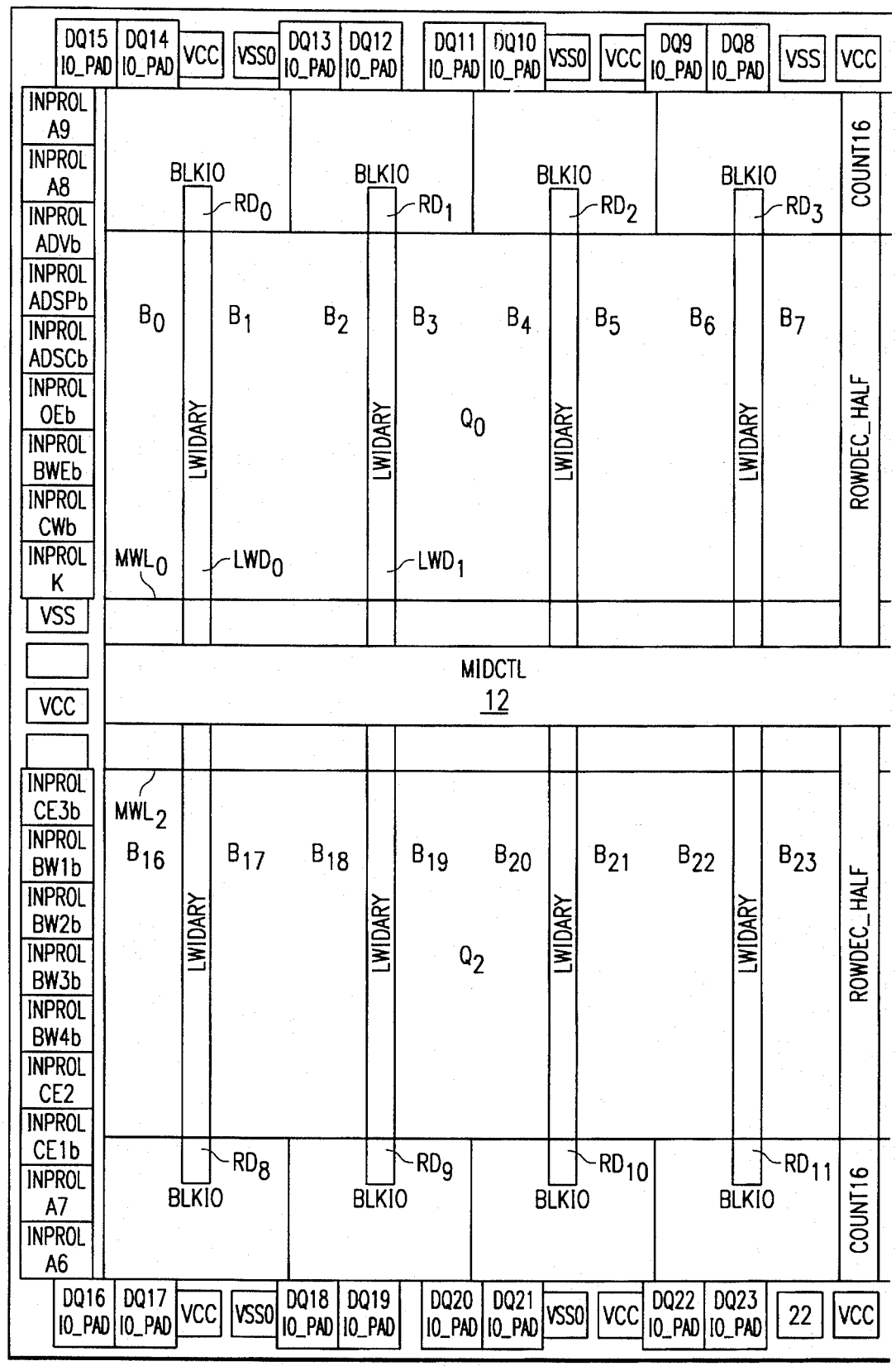
FIG. 1 is an electrical diagram, in block form, of an integrated circuit memory.
Figure 1B:
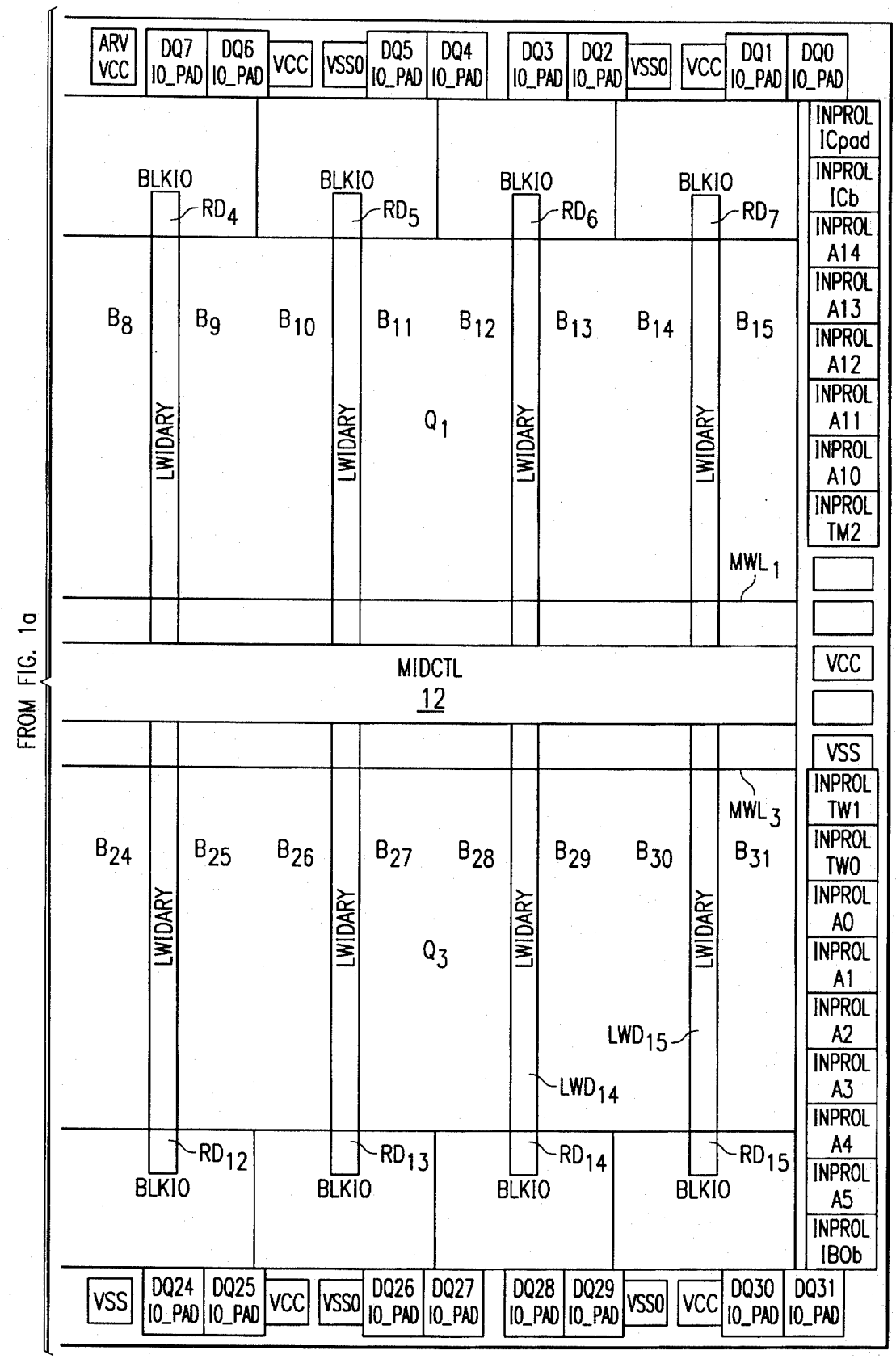

Referring to FIG. 1, a memory device 10 into which the preferred embodiment of the invention can be incorporated is shown. In this example, memory device 10 is a 32K×32 Burst Static Random Access Memory (Burst SRAM). The memory device can have its memory cells in a single block or in multi blocks. In the preferred embodiment of the invention the memory device 10 has an even number of blocks. In the present example thirty-two blocks $B_0, \ldots B_{31}$ are shown.

The blocks $B_0, \ldots B_{31}$ are divided into 4 quadrants $Q_0$, $Q_1, Q_2, Q_3$ of 8 blocks each. A master wordline decoder 12 runs through the center of the memory device 10. Master wordlines $MWL_0, MWL_1, MWL_2, MWL_3$ run through each quadrant. Local wordline decoders $LWD_0, \ldots LWD_{15}$ are located between each of pair of blocks.

The memory cells in memory device 10 are grouped into rows and columns. In this example, as is conventional, a row refers to the array direction in which a plurality of memory cells are selected by way of a word line. A column refers to the array direction in which memory cells in the selected row are selected for reading or writing.

Figure 2:
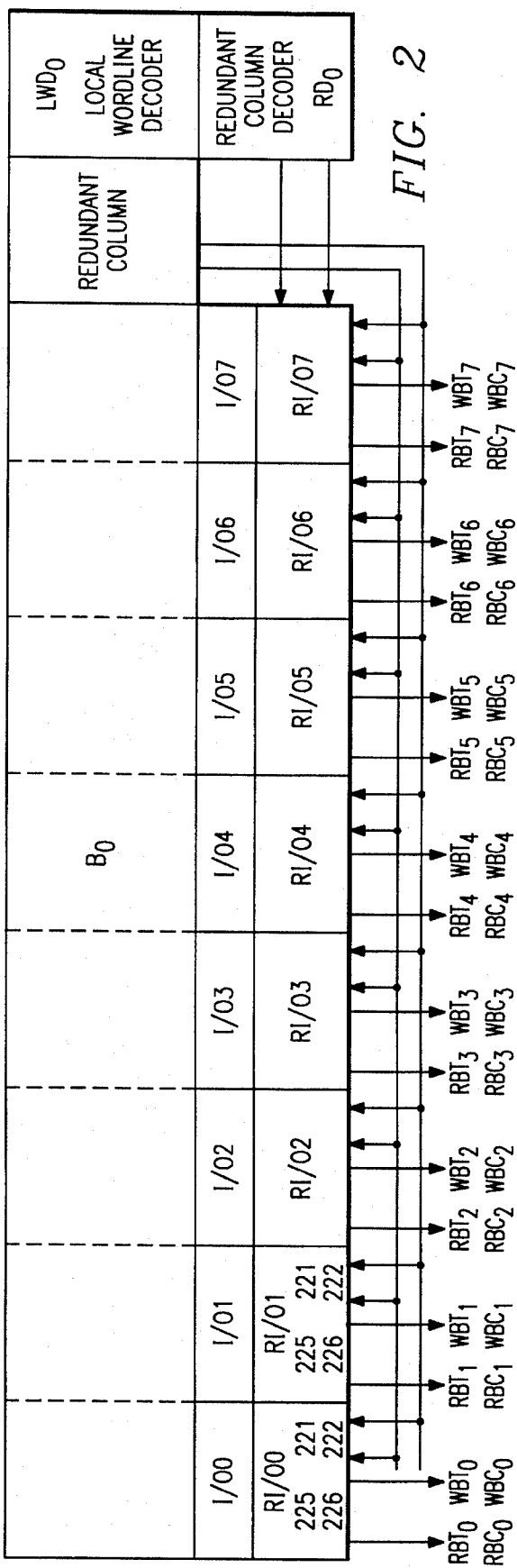
FIG. 2 is an electrical diagram, in block form, of a block in the integrated circuit memory of FIG. 1.

FIG. 2 shows a single memory block, $B_0$. Each block has eight input/output groups each having an input/output multiplexer circuit $I/O_0, \ldots I/O_7$ associated with it. In the preferred embodiment, each input/output group has sixteen adjacent primary columns of memory cells. Therefore, a memory device having thirty-two blocks, as in the present example, has 256 input/output groups, and 4096 columns.

Each input/output multiplexer circuit $I/O_0, \ldots I/O_7$ is associated with one read bus (true complement $RBT_0$, $RBC_0, \ldots RBT_7, RBC_7$) and one write bus (true and complement $WBT_0, WBC_0, \ldots WBT_7, WBC_7$), respectively. The read busses are connected to sense amplifiers. The write busses are connected to write drivers.

Figure 3:
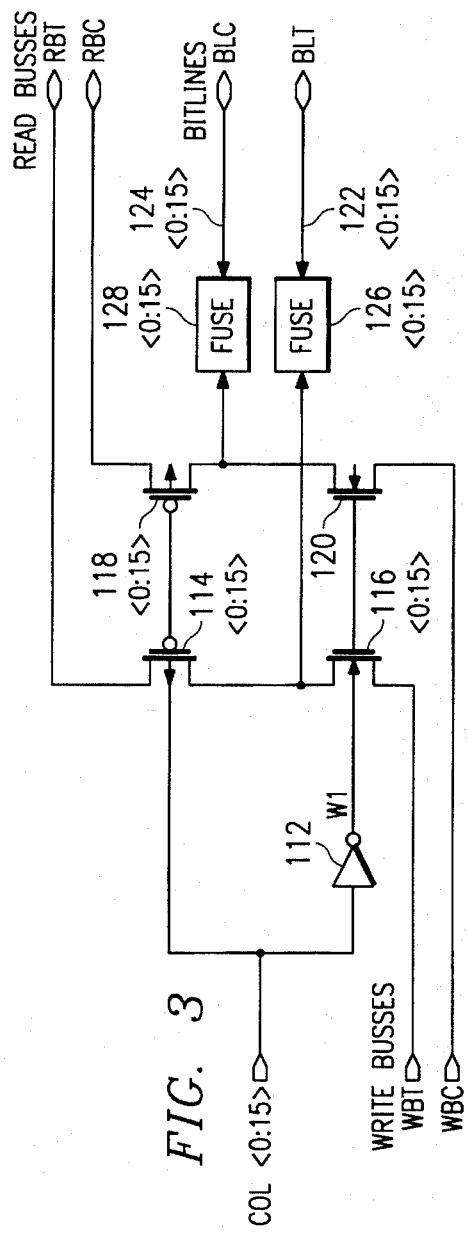
FIG. 3 is an electrical diagram, in schematic form, of an input/output multiplexer circuit for a primary column of memory cells.

The input/output multiplexer circuit can be any conventional input/output multiplexer circuit that allows for the disconnection of any primary column associated with it from the bitline-true and bitline-complement otherwise connected to that column. An input/output multiplexer circuit $I/O_0$ according to the preferred embodiment of the invention is shown in FIG. 3. The column select signal 22 drives the p-channel transistors 114, 118. The column select signal 22 inverted through inverter 112 drives the n-channel transistors 203, 120. There are sixteen placements of column select signals 22, transistors 114, 203, 118, 120, and inverters 112, as well as sixteen placements of bitline-true 122 and bitline-complement 124 each connected to one of the sixteen placements of the fuses 126, 128 respectively. In each of the sixteen placements the conduction path of transistor 114 is connected between bitline-true 122 through its associated fuse 126 and read bus true $RBT_0$. The conduction path of transistor 203 is connected between bitline-true 122 through its associated fuse 126 and write bus true $WBT_0$. The conduction path of transistor 118 is connected between bitline-complement 124 through its associated fuse 128 and read bus complement $RBC_0$. The conduction path of transistor 120 is connected between bitline-complement 124 through its associated fuse 128 and write bus complement $WBC_0$. There is only one placement of read bus true $RBT_0$, and complement $RBC_0$, and write bus true $WBT_0$ and complement $WBC_0$ in an input/output multiplexer circuit $I/O_0$.

When a defect is found in a memory cell the fuses 126, 128 connecting bitline-true 122 and bitline-complement 124 to the rest of the input/output multiplexer circuit are blown to disconnect them from the primary memory column. A redundant column is now be enabled to replace this primary column.

Each block has at least one redundant memory column. The number of redundant memory columns is based on balancing the probable number of columns with defective memory cells with the cost and additional die space of each additional redundant column. In the present example two redundant columns are added to each block. Since redundant columns are present in each block, no redundant block select circuitry is required. This reduces the programming overhead of the redundance architecture. Adding the redundant columns to each block also allows the redundant columns to use the same local word line drivers, coming from the local wordline decoder $LWD_0$, as the primary columns, also reducing the programming overhead.

The redundant decoder and redundant input/output select circuits are used for selecting the redundant columns and connecting them to the appropriate read and write busses. The redundant decoder and redundant input/output select circuits allow a redundant column to replace any of the columns in the block $B_0$. As can be seen in FIG. 1, redundant decoders $RD_0, \ldots RD_{15}$ are placed between every two blocks. Referring again to FIG. 2, each block includes eight redundant input/output select circuits $RI/O_0, \ldots RI/O_7$. Each input/output group has a redundant input/output select circuit $RI/O_0, \ldots RI/O_7$ associated with it and connected to the same read bus (true and complement $RBT_0, RBC_0, \ldots RBT_7, RBC_7$) and write bus (true and complement $WBT_0, WBC_0, \ldots WBT_7, WBC_7$) as the input/output multiplexer circuits $I/O_0, \ldots I/O_7$. Each of the redundant input/output select circuits $RI/O_0, \ldots RI/O_7$ in a block $B_0$ is connected through its associated redundant decoder $RD_0$ to each of the redundant columns in the block $B_0$. A redundant decoder $RD_0$ associated with the block $B_0$ drives all eight redundant input/output select circuits associated with the block $B_0$.

Figure 4A:
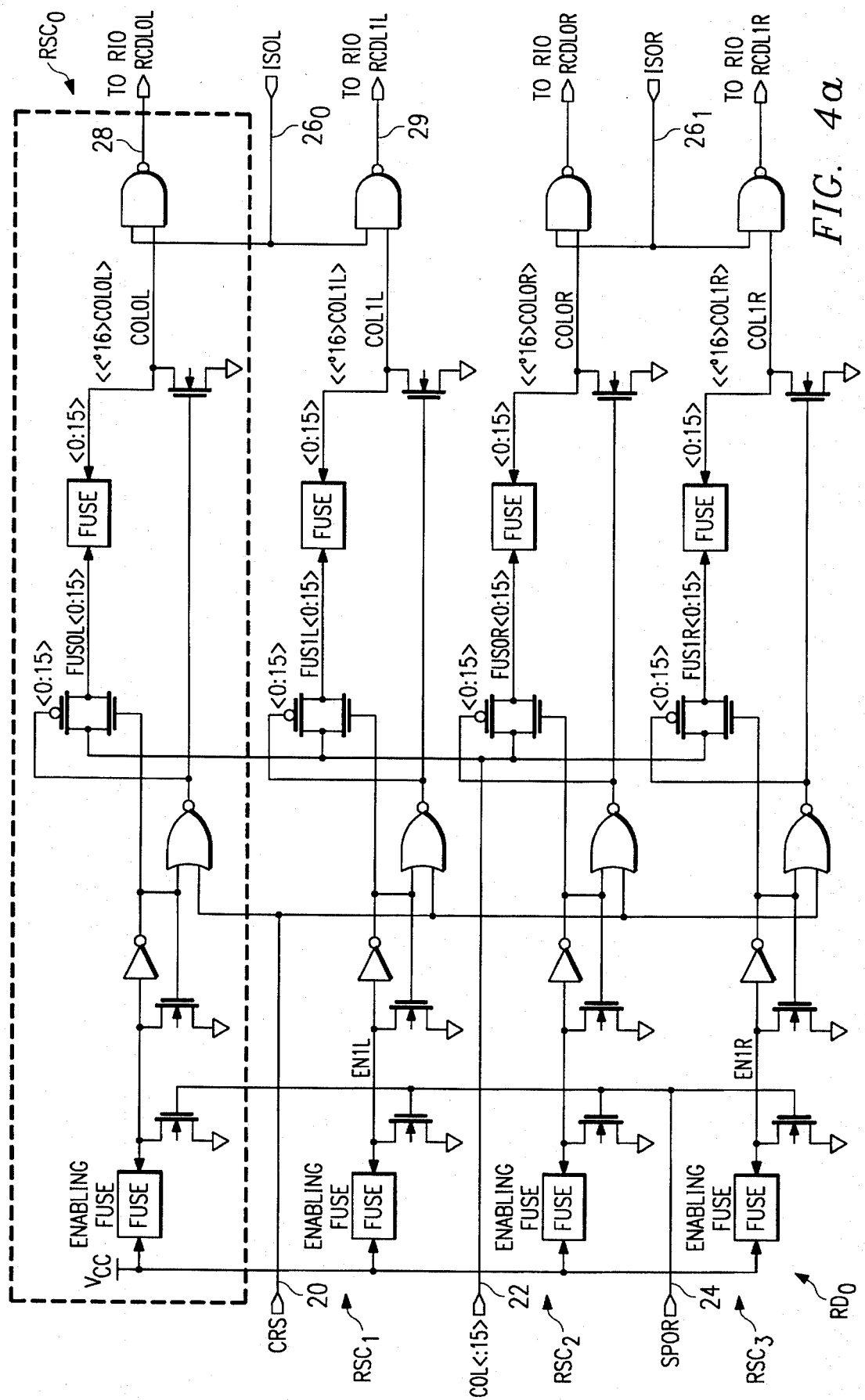
FIG. 4a is an electrical diagram, in schematic form, of a redundant decoder, according to the present invention.

Referring to FIG. 4a, one placement of a redundant decoder $RD_0$ will now be described. The redundant decoder $RD_0$ contains one redundant select circuit for each redundant column of each block it is associated with. In the present example, the redundant decoder $RD_0$ is associated with two blocks $B_0$ and $B_1$, each of which has two redundant columns. Therefore, the redundant decoder $RD_0$ has four redundant select circuits $RSC_0, RSC_1, RSC_2,$ and $RSC_3$. Two redundant select circuits $RSC_0, RSC_1$ are associated with redundant columns $C_0, C_1$ of the block to the left $B_0$ of the redundant decoder $RD_0$, respectively, and two redundant select circuits $RSC_0, RSC_1$ are associated with redundant columns $C_0, C_1$ of the block to the right $B_1$ of the redundant decoder $RD_0$, respectively.

Figure 4B:
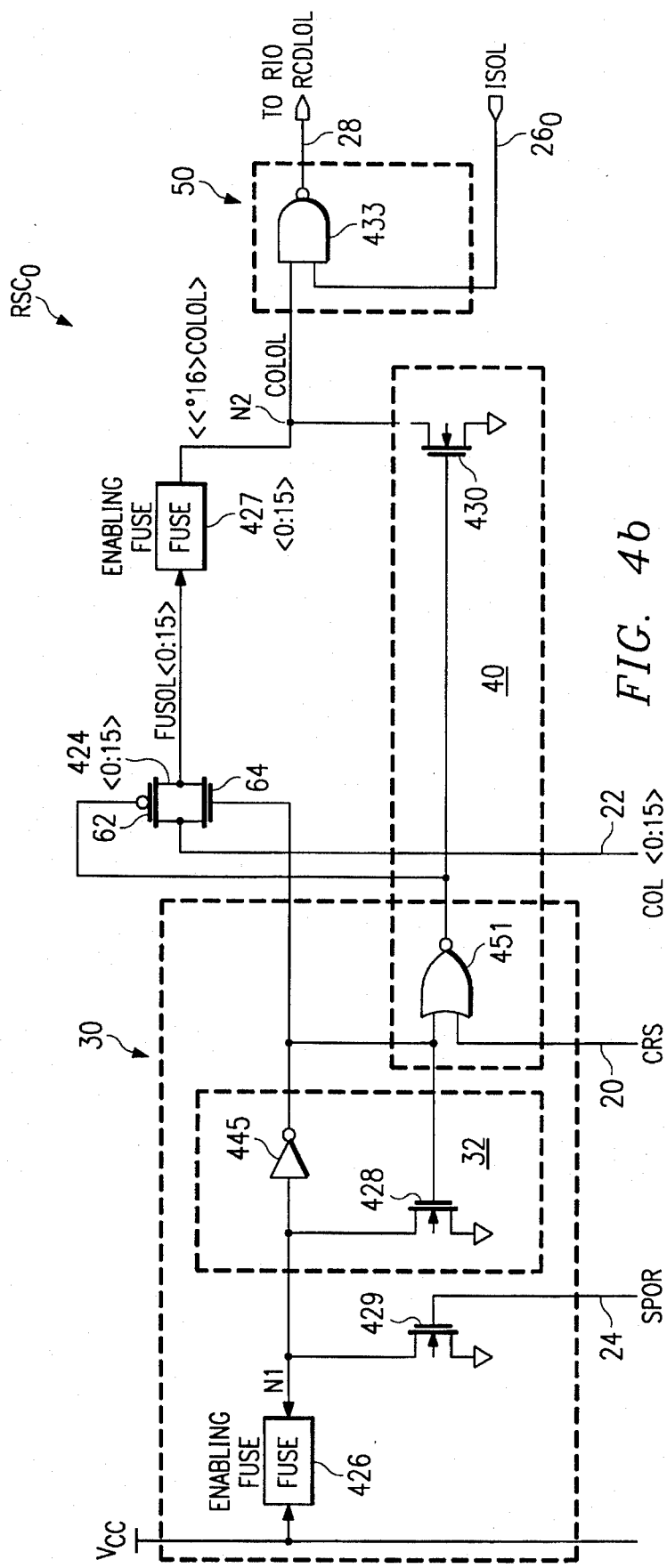
FIG. 4b is an electrical diagram, in schematic form, of a redundant select circuit, according to the present invention.

The redundant decoder $RD_0$ receives test control signal 20, a power on reset signal 24, and a column select signal 22, each of which serves as an input to the redundant select circuit $RSC_0$. Referring to FIG. 4b, one placement of the redundant select circuit $RSC_0$ will be referred to for ease of reference. There are sixteen placements of the columns select signal 22 in the redundant decoder $RD_0$, as illustrated by the notation "<0:15>". The redundant select circuit is composed of an enable circuit 30, a test control circuit 40, a pass element 424, a fuse 427, and an isolation circuit 50. In the preferred embodiment of the invention pass element 424 is a pass gate of complementary transistors with their conduction paths connected in parallel, although any other conventional component or combination of components for passing a signal, such as a single transistor can be used. There is one pass element 424 (hereinafter pass gate 424) and fuse 427 for each column select signal. Each pass gates 424 is connected in series with one fuse 427, and each of the sixteen combinations of one pass gate 424 in series with one fuse 427 is connected in parallel with the other fifteen.

When a redundant column replaces a primary column which has a defect a fuse is blown in the enabling circuit. Enabling circuit 30 enables the redundant select circuit, and drives the pass gate 424. Once the fuse is blown the enabling circuit should drive the pass gate 424 to allow the columns select signal 22 to be passed through the pass gate 424. Fifteen of the sixteen fuses 427 are blown, thus only one column select signal is connected to the redundant column and redundant input/output select circuit, and only one column select signal 22 is connected to the redundant input/output select circuit.

Referring to FIG. 4b, a detailed embodiment of the redundant select circuit will now be described. Enabling circuit 30 includes a fuse 426, a transistor 429, a half latch 32 made up of a transistor 428 an inverter 445, and a logic element 451, which is also a part of test control circuit 40. Fuse 426 is connected between Vcc and node N1. The conduction paths of the two transistors 428 and 429 are connected between node N 1 and ground. Transistor 429 is driven by the power-on-reset signal. The input of inverter 445 is also connected to node N1. The output of inverter 445 drives transistor 428 and is also the one of the inputs of the logic element 451.

Each pass gate 424 is made up of two complementary transistors. The output of the inverter 445 drives the pass gate n-channel transistor 64. The output of the logic element 451 drives the pass gate p-channel transistor 62. Each column select signal 22 is an input to one pass gate 424. Each fuse 427 is connected between the output of one pass gate 424 and node N2. Each of the sixteen combinations of one pass gate 424 in series with one fuse 427 is connected in parallel with the other fifteen.

The test control circuit 40 is made up of a test control circuit transistor 430 and logic element 451. As described above, the output of inverter 445 is one of the inputs of the logic element 451. The test control signal is the other input of the logic element 451. In addition to driving the pass gate p-channel transistor 62, the output of the logic element 451 also drives the test control circuit transistor 430. The logic element 451 can be any gate that ensures that:

(1) the test control circuit transistor 430 does not drive the logic state of node N2 to the logic state opposite the state of the column select signal when the column is selected; and (2) that the pass gate 424 conducts the input supplied to it when the redundant select circuit is enabled (this is based on the output state of the fuse of the enable circuit).

In the preferred embodiment of the invention the logic element 451 is a NOR gate and the test control circuit transistor 430 is n-channel.

The isolation circuit is a two input NAND gate 433. The first input of the NAND gate 433 is node N2. The second input of NAND gate 433 is the isolation signal $26_0$.

The output of the redundant select circuit will be at a low logic state when the redundant column is accessed, and at a high logic state when it is either not accessed or when the redundant select circuit is not enabled. If a redundant column is not replacing a primary column, the fuse 425 in the enabling circuit 30 remains intact and connects Vcc to node N1 bringing it high. This is inverted through inverter 445 to bring the output of the inverter 445 low, which turns off the pass gate n-channel transistor 64. The output of the inverter is also an inputs of the NOR gate 451. The test control signal 20 is low unless the circuit is in the stress test mode. When the circuit is not in the stress test mode the logic states of both the inputs of the NOR gate 451 are low. This turns the pass gate p-channel transistor 62 off, and since the pass gate n-channel transistor 64 is also off, pass gate 424 is off. It also turns the test control circuit n-channel transistor 430 on, bringing node N2 low. Node N2 is an input of NAND gate 433. Since it is low, the output 28 of the isolation circuit, which is also the output 28 of the redundant select circuit, will be high. This turns the redundant input/output select circuit off.

If a redundant column is replacing a primary column, fuse 426 is blown, and node N1 is low. The power-on-reset signal and transistor 429 insure that the half latch 32 powers up in the proper state. The half latch 32 latches the state of node N1 low. This makes the output of the inverter 445 high regardless of the state of test control signal 20. The output of the inverter 445 turns on the pass gate n-channel transistor 64. The high state at the output of the inverter 445 produces a low at the output of the NOR gate 451, which turns on pass gate p-channel transistor 62. Since both of the pass gate transistors 62, 64 are on, the pass gate 424 conducts the column select signal 22. Fifteen of the sixteen fuses 427 are blown, thus only one column select signal is connected to the redundant column. The output of the NOR gate 451 also turns off the test control circuit transistor 430, allowing node N2 to be at the state of the column select signal 22. Node N2 and the isolation signal $26_0$ are the inputs of NAND gate 433. The isolation signal $26_0$ is low when the sense amplifier is clocked, and high otherwise. The output of the isolation circuit 50, which is also the output of the redundant select circuit, is high when the sense amplifier is clocked, which turns off the redundant input/output select circuit. When the isolation amplifier is not clocked, i.e. the isolation signal is high, the output of the NAND gate 433 is the inverse of the state of node N2. The state of node N2 is the state of the one column select signal 22 whose associated fuse is not blown. Therefore, with the isolation signal $26_0$ high, when:

(1) the column select signal 22 high, indicating that the column is being accessed, the output 28 of the redundant select circuit $RSC_0$ is low, turning on the redundant input/output select circuit $RI/O_0$; and (2) the column select signal 22 is low, i.e. the column is not being accessed, the output 28 of the redundant select circuit $RSC_0$ is high, turning off the redundant input/output select circuit $RI/O_0$.

For every input/output group there is corresponding redundant input/output select circuit. Each input/output group is composed of adjacent columns corresponding to one data input/output bit.- The redundant bitlines (true and complement) are connected to each redundant input/output select circuit. The redundant decoder $RD_0$ controls all of the redundant input/output select circuits in a block $B_0$. The output 28, 29 of the redundant decoder $RD_0$ is common to all of the redundant input/output select circuits $RI/O_0$, ... $RI/O_7$ in the block $B_0$. In enabling a redundant column the seven the redundant input/output select circuits are disconnected from the enabled redundant column, typically by blowing a fuse in the seven other redundant input/output select circuits. Only the redundant input/output select circuit associated with the input/output group containing the primary column containing the defect remains connected to the enabled memory column. Thus, only one redundant input/output select circuit select is connected to the enabled column. Any redundant input/output select circuit that allows for the disconnection of the redundant column from an enabled redundant column can be used. The above-incorporated copending application Ser. No. 08/580,827 (Attorney's Docket No. 95-C-143) describes a preferred example of such redundant input/output select circuit, shown in FIG. 5.

Figure 5:
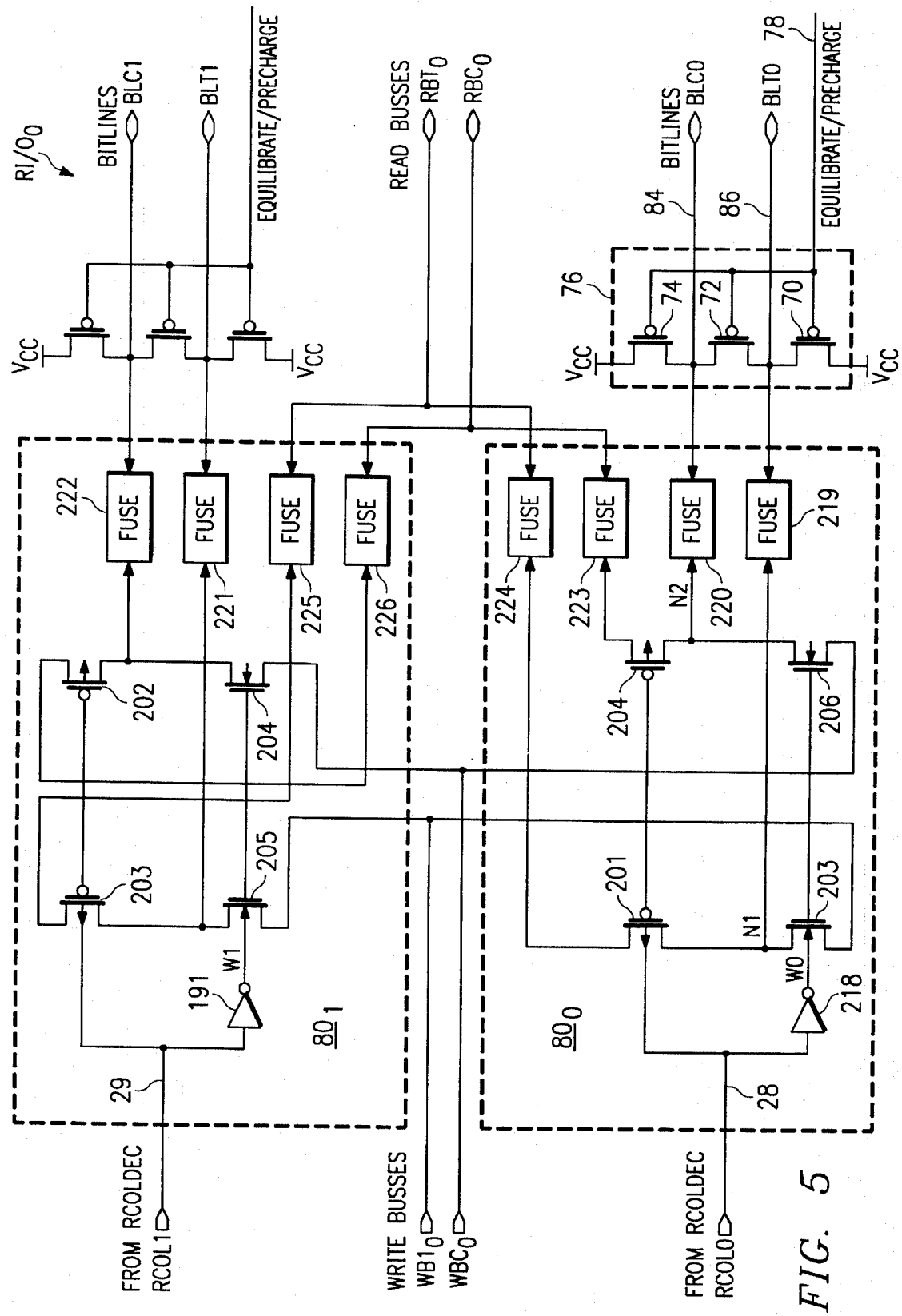
FIG. 5 is an electrical diagram, in schematic form, of a redundant input/output select circuit.

Referring to FIG. 5, the preferred embodiment of the redundant input/output select circuit $RI/O_0$ will be described. Each redundant input/output select circuit contains one redundant input/output circuit 80 for each redundant column in the block $B_0$. Thus in this example the redundant input/output select circuit $RI/O_0$ contains two redundant input/output circuits $80_0$, $80_1$.

A detailed embodiment of the redundant input/output circuit $80_0$ according to the preferred embodiment will now be described. The input signal 28 drives the p-channel transistors 201, 204. The input signal 28 inverted through inverter 218 drives the n-channel transistors 203, 206. The conduction path of a first transistor 201 is connected between a first bitline fuse 219, which is connected to redundant bitline-true 86 and a first permanently programmable selection element 224, such as a fuse (hereinafter fuse 224). Fuse 224 is connected to read bus true $RBT_0$. The conduction path of a second transistor 204 is connected between a second fuse 220, which is connected to redundant bitline-complement 84, and a second permanently programmable selection element 223, such as a fuse (hereinafter fuse 223), which is connected to read bus complement $RBC_0$. The conduction path of a third transistor 203 is connected between redundant bitline-true 86 through its associated first bitline fuse 219 and write bus true $WBT_0$. The conduction path of a fourth transistor 206 is connected between redundant bitline-complement 84 through its associated second fuse 220 and write bus complement $WBC_0$. One read bus true $RBT_0$, ... $RBT_7$ and complement $RBC_0$, ... $RBC_7$, and one write bus true $WBT_0$, ... , $WBT_7$ and complement $WBC_0$, ... $WBC_7$ correspond to one redundant input/output select circuits $RI/O_0$, ... , $RI/O_7$, respectively.

Each redundant input/output circuit $80_0$ is connected to equilibrate/precharge circuit 76, having three transistors 70, 72, 74. The conduction paths of transistor 70, 74 are connected between Vcc and redundant bitlines-true 86 and redundant bitline-complement 84, respectively. The conduction path of transistor 72 is connected between redundant bitline-true 86 and redundant bitline-complement 84. All of the transistors 70, 72, 74 are controlled by the equilibrate/precharge input 78. When fuses 219, 220 connecting the redundant input/output circuit $80_0$ to the redundant bitlines are intact nodes N1 and N2 are precharged to the appropriate logic state through transistors 70, 72, and 74 between each cycle. However, when fuses 219, 220 connecting the redundant input/output circuit to the redundant bitlines are blown the transistors 70, 72, 74 are disconnected from the redundant input/output circuit $80_0$, and it will not be precharged back to the appropriate logic state between cycles. There is one placement of the equilibrate/precharge circuit 76 for redundant column. Each equilibrate precharge circuit 76 is connected to each of the redundant input/output select circuits $RI/O_0$. ... $RI/O_7$.

In enabling a redundant column, eg. $C_0$, seven of the eight redundant input/output select circuits are disconnected from the enabled redundant column $C_0$ by blowing fuses 219, 220 connecting the redundant input/output circuit $80_0$ to redundant bitline-true 86 and redundant bitline-complement 84. The redundant input/output select circuit $RI/O_0$ associated with the input/output multiplexer circuit $I/O_0$ having the primary memory column being replaced remains connected to the redundant bitlines.

In the seven redundant input/output select circuits $RI/O_1$, $RI/O_2$, $RI/O_3$, $RI/O_4$, $RI/O_5$, $RI/O_6$, $RI/O_7$ disconnected from the redundant bitlines the fuses 223 and 224 connecting the redundant input/output circuit $80_0$ to the read bus true $RBT_0$, ... $RBT_7$ and complement $RBC_0$, ... $RBC_7$ are blown. This disconnects the redundant input/output circuit $80_0$ from the read bus true $RBT_0$, ... $RBT_7$ and complement $RBC_0$, ... $RBT_7$. The logic state on the nodes N1 and N2 of the redundant input/output circuit $80_0$ of the disconnected seven redundant input/output select circuits $RI/O_1$, $RI/O_2$, $RI/O_3$, $RI/O_4$, $RI/O_5$, $RI/O_6$, $RI/O_7$ now cannot pass through transistors 201 and 204 to the read buses (true and complement $RBT_0$, ... $RBT_7$, $RBC_0$, ... $RBT_7$) and slow down or corrupt the data being read from a primary column in the input/output groups $I/O_1$, $I/O_2$, $I/O_3$, $I/O_4$, $I/O_5$, $I/O_6$, $I/O_7$ with which the redundant input/output select circuits $RI/O_1$, $RI/O_2$, $RI/O_3$, $RI/O_4$, $RI/O_5$, $RI/O_6$, $RI/O_7$ are associated.

Therefore the invention reduces the number of pass gates in a redundant decoder. This allows quicker access to redundant columns and reduces the complexity of the redundancy circuit. It is particularly advantageous in synchronous circuits where the column select signal will requires a clock cycle to pass through each pass gate.

This is accomplished through the above described redundant decoder. The redundant decoder selects a redundant memory cell responsive to an address signal presented thereto. It has one or more redundant select circuits. Each of which has: (1) an enable circuit having an output indicating whether or not the redundant select circuit is enabled responsive to the state of a first fuse; (2) a plurality of pass elements connected in parallel, with each one having a conduction path and a control terminal coupled to the output of said enable circuit so that the pass element is conductive responsive to the enable circuit indicating that the redundant select circuit is enabled; and (3) a plurality of fuses, with each one connected in series with the conduction path of one pass element between an input and an output of the redundant select circuit, for disconnecting, when opened, the input from the output. The input of each one of the plurality pass elements is coupled to one address line corresponding to the column address signal. The path of the input of the redundant select circuit consists of only one of the plurality of pass elements connected in series with one of the plurality of fuses.

This redundant decoder can be in memory with a plurality of primary memory cells arranged in rows and columns and a plurality of redundant memory cell. The memory also having access circuitry for access a primary memory cell and a redundant decoder for selecting a redundant memory cell responsive to an address signal presented thereto.

The memory can further contain the above described redundant input/output select circuit having one or more redundant input/output circuits. With each redundant input/output circuit having a first permanently programmable selection element for disconnecting the redundant input/output circuit from a read bus true, and a second permanently programmable selection element for disconnecting the redundant input/output circuit from a read bus complement. Each redundant input/output select circuit also has at least one equilibrate/precharge circuit coupled to it, for precharging said redundant input/output circuit. Each equilibrate precharge circuit 76 is connected to each of the redundant input/output select circuits $RI/O_0 \ldots RI/O_7$. The first and second permanently programmable selection elements can disconnect the redundant input/output circuits from the read bus true and read bus complement in each redundant input/output circuit coupled to an enabled redundant column in a redundant input/output select circuit not associated with an input/output group having a memory cell having a defect.

While the invention has been specifically described with reference to a preferred embodiment, it will be understood by those of ordinary skill in the prior art having reference to the current specification and drawings that various modifications may be made and various alternatives are possible therein without departing from the spirit and scope of the invention.

For example:

Although the invention is described in relation to SRAMs the invention can be used in other types of memories having memory array s including redundant columns, including read-only memories, FIFOs, DRAMs, EPROMs, EEPROMs, and microprocessors and other devices which have embedded memories without departing from the scope of the invention.

Additionally, antifuses, nonvolatile latched or other permanently programmable selection techniques can be used instead of the fuses without departing from the scope of the invention.

I claim:

1. A redundant decoder for selecting a redundant memory cell responsive to an address signal presented thereto, said redundant decoder comprising:
    one or more redundant select circuits, each comprising:
        an enable circuit, comprising a first permanently programmable selection element, having an output indicating whether or not the redundant select circuit is enabled responsive to the state of said first permanently programmable selection element;
        a plurality of pass elements connected in parallel, wherein each one of said pass elements has a conduction path, and has a control terminal coupled to the output of said enable circuit so that said pass elements are conductive responsive to the enablecircuit indicating that the redundant select circuit is enabled;
        a plurality of permanently programmable selection elements, wherein each one of said plurality of permanently programmable selection elements connected in series with the conduction path of one pass element between an input and an output of the redundant select circuit, for disconnecting, when opened, said input from said output;
        wherein said input of each one of said plurality pass elements is coupled to one address line corresponding to the column address signal; and
        wherein a path of said input of said redundant select circuit consists of only one of said plurality of pass elements connected in series with one of said plurality of permanently programmable selection elements.

2. The redundant decoder of claim 1, wherein each one of said plurality of permanently programmable selection elements comprises a fuse, and wherein each fuse except one in said plurality of fuses is blown.

3. The redundant decoder of claim 1, wherein the number of said redundant select circuit in said redundant decoder is equal to the number of redundant columns associated with a block of memory.

4. The redundant decoder of claim 1, wherein the number of said redundant select circuits in said redundant decoder is equal to the number of redundant columns associated with two adjacent blocks of memory.

5. The redundant decoder of claim 1, wherein said redundant select circuit further comprises a test control circuit for placing each redundant memory cell connected into stress test mode responsive to a test control signal.

6. The redundant decoder of claim 1, wherein said redundant select circuit further comprises an isolation circuit for isolating said redundant memory cells responsive to a sense isolation signal.

7. The redundant decoder of claim 1, wherein each said pass element in said redundant select circuit comprises a pass gate of complementary transistors having their conduction paths connected in parallel.

8. A redundant decoder for selecting a redundant memory cell responsive to an address signal presented thereto, said redundant decoder comprising:
    one or more redundant select circuits, each comprising:
        an enable circuit, comprising a first fuse, having an output indicating whether or not the redundant select circuit is enabled responsive to the state of said first fuse;
        a plurality of pass gates connected in parallel, wherein each one of said pass gates has a conduction path, and has a control terminal coupled to the output of said enable circuit so that said pass gates are conductive responsive to the enable circuit indicating that the redundant select circuit is enabled, and
        a plurality of fuses, wherein each one of said plurality of fuses are each connected singly in series with the conduction path of one pass gate between an input and an output of the redundant select circuit, for disconnecting, when opened, said input from said output.

9. The redundant decoder of claim 8, wherein each fuse except one in said plurality of fuses is blown.

10. The redundant decoder of claim 8, wherein said input of each one of said plurality of pass gates is coupled to one address line corresponding to the column address signal.

11. The redundant decoder of claim 10, wherein the number of said redundant select circuit in said redundant decoder is equal to the number of redundant columns associated with a block of memory.

12. The redundant decoder of claim 10, wherein the number of said redundant select circuits in said redundant decoder is equal to the number of redundant columns associated with two adjacent blocks of memory.

13. The redundant decoder of claim 8, wherein said redundant select circuit further comprises a test control circuit for placing each redundant memory cell connected into stress test mode responsive to a test control signal.

14. The redundant decoder of claim 8, wherein said redundant select circuit further comprises an isolation circuit for isolating said redundant memory cells responsive to a sense isolation signal.

15. The redundant decoder of claim 8, wherein each said pass gate in said redundant select circuit comprises complementary transistors having their conduction paths connected in parallel.

16. A memory comprising:
   a plurality of primary memory cells arranged in rows and columns;
   an accessing circuit for accessing a primary memory cell;
   a plurality of redundant memory cells;
   a redundant decoder for selecting a redundant memory cell responsive to an address signal presented thereto, said redundant decoder comprising at least one redundant select circuit, wherein each said redundant select circuit comprises:
      an enable circuit, comprising a first fuse, having an output indicating whether or not the redundant select circuit is enabled responsive to the state of said first fuse;
      a plurality of pass elements connected in parallel, wherein each one of said pass elements has a conduction path, and has a control terminal coupled to the output of said enable circuit so that said pass elements are conductive responsive to the enable circuit indicating that the redundant select circuit is enabled; and
      a plurality of fuses, wherein each one of said plurality of fuses are each connected singly in series with the conduction path of one pass element between an input and an output of the redundant select circuit, for disconnecting, when opened, said input from said output.

17. The memory of claim 16, wherein each fuse except one in said plurality of fuses is blown.

18. The memory of claim 16, wherein accessing circuit comprises an input/output multiplexer circuit.

19. The memory of claim 16, wherein said row and columns of said primary memory cells grouped into at least one block, with each said block divided into a plurality of input/output groups.

20. The memory of claim 19, wherein each one of said plurality of input/output groups has a plurality of columns.

21. The memory of claim 16, wherein said input of each one of said plurality of pass elements is coupled to one address line corresponding to the column address signal.

22. The memory of claim 21, further comprising a plurality of redundant input/output select circuits, with one redundant input/output select circuit within each input/output group, and with each redundant input/output select circuit coupled to each redundant column associated with the block containing said input/output group.

23. The memory of claim 21, wherein the number of said redundant select circuits in said redundant decoder is equal to the number of redundant columns associated with one said block.

24. The memory of claim 21, wherein the number of said redundant select circuits in said redundant decoder is equal to the number of redundant columns associated with two adjacent blocks of memory.

25. The memory of claim 16, wherein said redundant select circuit further comprises a test control circuit for placing each redundant memory cell connected into stress test mode responsive to a test control signal.

26. The redundant decoder of claim 16, wherein said redundant select circuit further comprises an isolation circuit for isolating said redundant memory cells responsive to a sense isolation signal.

27. The memory of claim 16, wherein each said pass element comprises a pass gate with complementary transistors having their conduction paths connected in parallel.

28. The memory of claim 16, wherein said plurality of said primary memory cell and said plurality of said redundant memory cells comprise a synchronous random access memory.

29. A redundancy structure of an integrated circuit memory device comprising:
   a plurality of primary memory cells arranged in rows and columns;
   an accessing circuit for accessing a primary memory cell;
   a plurality of redundant memory cells;
   a redundant decoder comprising at least one redundant select circuit for accessing a redundant memory cell responsive to an address signal presented thereto, comprising:
      a first fuse for enabling said redundant select circuit;
      a half latch comprising of a first transistor and an inverter for latching the logic state an the output of said first fuse when said redundant select circuit is enabled;
      a second transistor having its conduction path connected between said first fuse and ground and controlled by a power-on-reset signal for placing said half latch in the proper logic state upon power up;
      a logic element having a first input coupled to said inverter, a second input coupled to a test control signal, and an output;
      a third transistor having a control terminal coupled to said output of said logic element, for ensuring said redundant column is not selected responsive to said test control signal and said redundant select circuit not being enabled;
      a plurality of pass gates connected in parallel comprising complementary transistors having their conduction paths connected in parallel, wherein each one of said pass gates has a conduction path, and has a control terminal coupled to the output of said inverter and a control terminal coupled to said output of said logic element so that said pass gates are conductive responsive to the enable circuit indicating that the redundant select circuit is enabled;
      a plurality of fuses, wherein each one of said plurality of fuses connected in series with the conduction path of one pass gate between an input and an output of the redundant select circuit, for disconnecting, when opened, said input from said output; and
      an NAND gate coupled to said third transistor and said plurality of fuses for isolating said redundant memory cells responsive to a sense isolation signal.

30. The memory of claim 29, wherein each fuse except one in said plurality of fuses is blown.

31. The redundancy structure of claim 29, wherein said input each one of said plurality of pass gates is coupled to one address line corresponding to the column address signal.

32. The redundancy structure of claim 31, wherein the number of said redundant select circuit in said redundant decoder is equal to the number of redundant columns associated with a block of memory.

33. The redundancy structure of claim 31, wherein the number of said redundant select circuit in said redundant decoder is equal to the number of redundant columns associated with two adjacent blocks of memory.

34. The redundancy structure of claim 29, wherein said logic element is a NOR gate.

35. A memory comprising:
   a plurality of primary memory cells arranged in rows and columns;
   an accessing circuit for accessing a primary memory cell;
   a plurality of redundant memory cells;

a redundant decoder for selecting a redundant memory cell responsive to an address signal presented thereto, said redundant decoder comprising at least one redundant select circuit, wherein each said redundant select circuit comprises:

an enable circuit, comprising a first fuse, having an output indicating whether or not the redundant select circuit is enabled responsive to the state of said first fuse;

a plurality of pass gates connected in parallel, wherein each one of said pass gates has a conduction path, and has a control terminal coupled to the output of said enable circuit so that said pass gates are conductive responsive to the enable circuit indicating that the redundant select circuit is enabled, and a plurality of fuses, wherein each one of said plurality of fuses connected in series with the conduction path of one pass gate between an input and an output of the redundant select circuit, for disconnecting, when opened, said input from said output; and one or more redundant input/output select circuit, with one redundant input/output select circuit associated with one of a plurality of input/output groups, wherein each redundant input/output select circuit comprises:

one or more redundant input/output circuits, each comprising:

a first permanently programmable selection element for disconnecting said redundant input/output circuit from a read bus true; and a second permanently programmable selection element for disconnecting said redundant input/output circuit from a read bus complement; and at least one equilibrate/precharge circuit coupled to said redundant input/output circuit, for precharging said redundant input/output circuit.

36. The memory of claim 35, wherein a path of said input of said redundant select circuit consists of only one of said plurality of pass gates connected in series with one of said plurality of fuses.

37. The memory of claim 35, wherein each fuse except one in said plurality of fuses is blown.

38. The memory of claim 35, wherein accessing circuit comprises an input/output multiplexer circuit.

39. The memory of claim 35, wherein said redundant select circuit further comprises a test control circuit for placing each redundant memory cell connected into stress test mode responsive to a test control signal.

40. The redundant decoder of claim 35, wherein said redundant select circuit further comprises an isolation circuit for isolating said redundant memory cells responsive to a sense isolation signal.

41. The memory of claim 35, wherein each said pass gate comprises complementary transistors having their conduction paths connected in parallel.

42. The memory of claim 35, wherein each one of said plurality of input/output groups has a plurality of adjacent columns.

43. The memory of claim 35, wherein said input of each one of said plurality of pass gates is coupled to an address line corresponding to the column address signal.

44. The memory of claim 43, wherein the number of said redundant select circuits in said redundant decoder is equal to the number of redundant columns associated with one said block.

45. The memory of claim 43, wherein the number of said redundant select circuits in said redundant decoder is equal to the number of redundant columns associated with two adjacent blocks of memory.

46. The memory of claim 35, wherein the number of said redundant input/output circuits in each one of said redundant input/output select circuit is equal to the number of redundant columns associated with a block of memory, with each redundant input/output circuit coupled to one redundant column.

47. The memory of claim 46, wherein said first and second permanently programmable selection elements disconnect said redundant input/output circuits from said read bus true and said read bus complement in each redundant input/output circuit coupled to an enabled redundant column in a redundant input/output select circuit not associated with an input/output group having a memory cell having a defect.

48. The memory of claim 35, wherein said first and second permanently programmable selection elements comprise a fuse.

49. The memory of claim 35, wherein said plurality of said primary memory cell and said plurality of said redundant memory cells comprise a synchronous random access memory.

50. The memory of claim 35, wherein said redundant input/output circuit further comprises:

a first transistor having a conduction path coupled between said first permanently programmable selection element and a first bitline fuse coupled to a redundant bitline-true; and a second transistor having a conduction path coupled between said second permanently programmable selection element and a second fuse coupled to a redundant bitline-complement;

wherein both said first and second transistors are controlled by an input of said redundant input/output circuit.

51. The memory of claim 35, wherein said redundant input/output circuit further comprises:

a third transistor having a conduction path coupled between write bus true and redundant bitline-true; and a fourth transistor having a conduction path coupled between write bus complement and redundant bitline-complement;

wherein both said third and said fourth transistors are controlled by an inverted input of said redundant input/output circuit.

52. A method of operating a memory to access a redundant memory cell, said memory including a plurality of primary memory cells arranged in rows and columns, an accessing circuit for accessing a primary memory cell, a plurality of redundant memory cells, said method comprising:

opening a first fuse in an enable circuit of a redundant select circuit in a redundant decoder, said enable circuit having its output coupled to a plurality of pass elements so that, when said first fuse is opened, said plurality of pass elements are made conductive, wherein each one of said plurality of pass elements being connected singly in series with one fuse of a plurality of fuses between an input and an output of said redundant select circuit;

opening each fuse except one in said plurality of fuses according to a determined column address value.

53. The method of claim 52, wherein said input of each one of said plurality of pass elements is coupled to one address line corresponding to a column address signal.

54. The method of claim 52, further comprising the steps of:

opening each first bitline fuse except one according to said determined column address value, wherein each first bitline fuse is coupled between a redundant bitline-true and a redundant input/output circuit in one of a plurality of redundant input/output select circuits; and, opening each second bitline fuse except one according to said determined column address value, wherein each second bitline fuse is coupled between a redundant bitline-complement and a redundant input/output circuit in one of said plurality of redundant input/output select circuits;

wherein each one of said plurality of said redundant input/output circuits is coupled to said redundant decoder.

55. The method of claim 54, further comprising the steps of:

opening each first permanently programmable selection element except one according to said determined address value, wherein each first permanently programmable selection element is coupled between a read bus true and a redundant input/output circuit in one of said plurality of redundant input/output select circuits; and opening each second permanently programmable selection element except one according to said determined address value, wherein each second permanently programmable selection element is coupled between a read bus complement and a redundant input/output circuit in one of said plurality of redundant input/output select circuits.

56. The method of claim 54, further comprising the steps of:

opening a first fuse coupled between an input/output multiplexer circuit and a primary bitline-true according to said determined column address value; and opening a second fuse coupled between said input/output multiplexer circuit and a primary bitline-complement according to said determined column address value;

wherein said input/output multiplexer circuit is associated with a redundant input/output select circuit having its fuse not opened.

* * * * *